United States Patent [19]

Varadan et al.

[11] Patent Number: 5,366,664
[45] Date of Patent: Nov. 22, 1994

[54] ELECTROMAGNETIC SHIELDING MATERIALS

[75] Inventors: Vijay K. Varadan; Vasundara V. Varadan; Neil R. Williams; Joseph W. Cresko, all of State College, Pa.

[73] Assignee: The Penn State Research Foundation, University Park, Pa.

[21] Appl. No.: 878,153

[22] Filed: May 4, 1992

[51] Int. Cl.$^5$ ............ H01B 1/00; H01B 1/20; H01B 1/22

[52] U.S. Cl. ............ 252/512; 252/513; 252/518; 106/1.18; 106/1.25; 428/364; 428/372; 428/402; 428/484

[58] Field of Search ............ 252/500, 506, 511, 513, 252/518, 512; 106/1.18, 1.25, 1.12; 428/364, 372, 402, 484

[56] References Cited

U.S. PATENT DOCUMENTS

| | | | |
|---|---|---|---|
| 4,552,688 | 11/1985 | Sakamoto et al. | 253/511 |
| 4,554,094 | 11/1985 | Bäbley et al. | 252/519 |
| 4,596,670 | 6/1986 | Liu | 252/511 |
| 4,777,205 | 10/1988 | LaScola et al. | 252/511 |
| 4,910,389 | 3/1990 | Sherman et al. | 219/548 |
| 4,961,879 | 10/1990 | May et al. | 252/513 |
| 5,075,038 | 12/1991 | Cole et al. | 252/514 |
| 5,108,791 | 4/1992 | Chung et al. | 427/208.8 |
| 5,171,479 | 12/1992 | Maki et al. | 252/511 |

*Primary Examiner*—Paul Lieberman
*Assistant Examiner*—M. Kopec
*Attorney, Agent, or Firm*—Thomas J. Monahan

[57] ABSTRACT

The present invention provides for conductive electromagnetic shielding (EMS) compositions which can be formulated to provide effective shielding over a broad range of frequencies, e.g. 30 MHz. to 110 GHz. which is based on a mixture of a polymeric or liquid matrix material and a synergestic combination of conductive powders, fibers and optional flake components. The invention also provides for formulations containing the above composition which are adapted for EMS applications such as pliable caulking, thermoformable shaped articles such as housings and cabinetry, flexible gasket material, shielding curtains, coatings and paints which may be applied to substrates such as glass, plastic or metal, structural composites, conformal coatings for printed circuit boards and like applications.

59 Claims, No Drawings

ELECTROMAGNETIC SHIELDING MATERIALS

FIELD OF THE INVENTION

The present invention relates to a conductive composition of matter which exhibits improved electromagnetic shielding properties.

DESCRIPTION OF THE PRIOR ART

In many electronic enclosures, it is desirable to seal or block openings in the chassis so that various electromagnetic noise and signals do not escape into the surrounding environment and so that external signals do not enter the enclosure. For example, such electromagnetic noise can interfere with nearby television and radio equipment to the consternation of consumers.

In the past, this type of electromagnetic noise and associated signals have been controlled by designing enclosures which have openings that are much smaller than the wavelength of the electromagnetic noise involved. Where it is necessary to cover larger openings, such as for access openings, one past practice has been to use a suitable EMI/EMC gasket to surround the opening to provide electrical contact between the cover and the enclosure. In the industry, "EMI" refers to electromagnetic interference, "EMC" refers to electromagnetic control and "EMS" refers to electromagnetic shielding. Those EMI/EMC gaskets are typically made from a metal-filled or solid metal material such as beryllium copper which is a good conductor and which is arranged to provide an electrical seal that can conform to an irregular surface which makes electrical contact with adjacent metallic surfaces. Those types that have openings or particle separation must be opaque to electromagnetic noise at the frequencies of interest.

Recently, attempts have been made to prepare conductive plastics by the addition of certain conductive fillers. Specifically, these fillers include conductive powders, flakes and fibers. Generally, approximately 25-40% by wt. of conductive powder, 36-49% by wt. of conductive flake or 25-30% by wt. of conductive fiber must be present in order to obtain EMI/RFI shielding. (Materials Engineering, March, 1982, P. 37-43; Modern Plastics International September, 1982, P. 46-49).

One such composition suitable for the fabrication of electromagnetic shielding housings for electronic equipment is disclosed in U.S. Pat. No. 4,596,670. This composition is based on a thermoplastic polymer mixed with a combination of conductive fillers comprising a mixture of from about 25 to 50% by weight of metal flake, about 2 to 12% by weight of conductive metal fiber or metal coated fiber and about 2 to 15% by weight of a conductive carbon powder such as carbon black.

U.S. Pat. No. 4,910,389 discloses conductive EMS compositions based on a mixture of a crystalline polymer material and mixed conductive fillers, one of which is carbon black and the other of which is a semi conductive material such as a metal oxide or metal sulfide material, most preferably zinc oxide.

U.S. Pat. No. 4,552,268 discloses electroconductive silicone elastomer materials containing nickel-coated carbon such as carbon black or graphite particles and a platinum compound.

While these and other developments have led to the provision of materials which exhibit improved EMS properties, there is a continuing need for shielding materials which are versatile enough to be formulated for various applications such as a caulk, gasket material, sheet material or sprayable material and which can be also tailored to provide EMS properties over a broader range of electromagnetic frequencies from about 30 MHz. to 110 GHz.

SUMMARY OF THE INVENTION

The present invention provides for conductive electromagnetic shielding (EMS) compositions which can be formulated to provide effective electromagnetic (EM) shielding over a broad range of frequencies, e.g. 30 MHz. to 110 GHz., which is based on a mixture of a polymeric or liquid matrix material and a synergistic combination of conductive powders, fibers and optional flake components. More specificaly, the composition comprises a substantially uniform mixture of:

i) a matrix component selected from the group consisting of silicone oils, silicone waxes, curable elastomers, thermoplastic polymers thermosetting polymers and mixtures thereof;

ii) a preferably synergestic combination of conductive additives comprising:
 a) from about 1 to about 10% by weight of one or more conductive fiber materials,
 b) from about 10 to about 60% by weight of one or more conductive metal powder materials, wherein the weight range of said powder to said fiber is in the range of from about 1:10 to about 20:1 respectively,
 c) from 0 to about 35% by weight of conductive metal flake material
 d) from 0 to about 25% by weight of an organic compound containing at least one cyano group per molecule, said conductive additives being uniformly dispersed in said matrix material.

The invention also provides for formulations containing the above composition which are adapted for EMS applications such as pliable caulking, thermoformable shaped articles such as housings and cabinetry, flexible gasket material, shielding curtains, coatings and paints which may be applied to substrates such as glass, plastic or metal, structural composites, conformal coatings for printed circuit boards and like applications.

DETAILED DESCRIPTION OF THE INVENTION

The matrix material into which the EMS components are dispersed may include liquid polymers (oils) and electrically conductive or non-conductive polymeric materials.

Silicone oils and the higher molecular weight silicone waxes and mixtures thereof provide a particularly suitable matrix material where the EMS composition is formulated into a pliable caulking or putty-like material. These materials may be generally categorized as polydialkyl or polydiaryl organopolysiloxanes having the recurring structure $[0-Si(R)_2]_n$ wherein R represents the same or different monovalent hydrocarbon radicals having from 1 to 18 carbon atoms and n is the degree of polymerization. These molecules are terminated with tri organo siloxy end groups. For caulking applications, the polyorganosiloxane does not contain any groups which undergo crosslinking reactions either at or above room temperature. Preferred materials have a molecular weight such that they are liquid to semi-solid waxes at room temperatures. The most preferred silicone oil is polydimethylsiloxane wherein the polymer is capped by trimethylsiloxy groups.

Curable elastomeric polymers are the preferred matrix materials where the EMS composition is designed for use in the fabrication of flexible gaskets, sheet lining material or shielding curtain material. Such elastomers include diolefin polymers and copolymers such as polybutadiene, polyisoprene, polychloroprene, copolymers of butadiene with styrene or acrylonitrile, curable ethylene/propylene copolymers and ethylene/propylene/non-conjugated diene terpolymers, polyurethane, silicone rubber and like materials as are known in the art.

A particularly preferred elastomer is silicone rubber which tends to give superior EMS properties. Silicone rubbers are well known materials which are prepared by crosslinking organopolysiloxanes having the structure $R^1(SiR_2O)_xSiR^1$ wherein R represents the same or different monovalent hydrocarbon radicals or substituted monovalent hydrocarbon radicals having from 1 to 18 carbon atoms, $R^1$ represents condensable groups, hydrolyzable groups, monovalent hydrocarbon radicals and monovalent hydrocarbon radicals having aliphatic unsaturation and x is a number greater than 10.

Crosslinking agents which may be used to cure these polymers are selected such that they will be reactive with a substituent group present in the polyorganosiloxane molecules. These include silane compounds having more than two silicon-bonded hydrolyzable groups per molecule such as methyltrimethyoxysilane, vinyltrimethyoxy silane and like alkoxy group containing silanes. A curing catalyst is also used to catalyze the crosslinking reaction. Such catalysts include metal salts of carboxylic acids such as iron octoate or tin octoate.

Thermoplastic polymer matrix materials may be used where the EMS composition is used to prepare thermoformable articles such as rigid sheet material, cabinetry or housings for electronic devices such as computers, circuit protectors and the like.

Preferred thermoplastic polymers which may be used include polyolefins, polymethacrylates, polyesters, polycarbonates, copolyestercarbonates, polyamides, polyarlene ether sulfones or ketones, polyamide imides, polyetherimides, polyphenylene ethers, polystyrenes, acrylonitrile-butadiene-styrene copolymers or blends thereof. These thermoplastic polymers may further comprise one or more addition polymers and/or one or more rubber or rubber modified thermoplastic resins.

These materials can be molded, foamed, extruded or otherwise shaped into various structures and articles.

In other EMS applications, the preferred matrix material is a thermosetting polymer which can be crosslinked to form a rigid, thermoset composition.

These materials are particularly suitable for the preparation of paints, coatings or composite fiber materials impregnated with the EMS composition.

Suitable thermoset polymers include crosslinkable epoxy, polyester, phenolic, alkyd and polyurethane resins as are well known in the art and which may be crosslinked using known reagents such as diamines, styrene monomers, organoperoxides and the like.

These fluids or polymeric materials form a matrix material into which is dispersed the preferably sytnergestic combination of conductive powders, fibers, flake and cyano-containing materials which impart the EMS properties to materials and structures containing them.

The conductive powders which form an ingredient of the EMS compositions of this invention are generally semi-conductive core metal oxides or sulfides which are coated (doped) with a conductive metal which exhibits anti-corrosion properties. Suitable core powders include ZnO, ZnS, CdS, PbS, $NbO_2$, $MnO_2$, $SnO_2$, $In_2O_3$, $MoS_2$ and NiO. Preferred core particles are ZnO and $SnO_2$.

Preferred dopant metals are antimony and indium. These doped powders are commercially available or can be readily prepared by methods known in the art such as chemical or electrochemical reactions with metal donating materials. The content of the dopant in the powder may range from about 0.5 to about 5% by weight, more preferably from about 0.5 to about 3% by weight. The average particle size of the conductive powders may range from about 0.1 to about 50 microns, more preferably from about 0.1 to about 25 microns, most preferably from about 0.2 to about 4 microns.

The conductive fibers which may be used in the invention include short conductive fibers which may be metallic or metal coated fibers. Generally, the metal fibers may be made of aluminum, copper, silver, nickel, stainless steel and the like, and alloys thereof. Similarly, the metal coated fibers are generally of a graphite or glass core with a coating of silver, nickel, aluminum or copper and the like and alloys thereof.

Particularly, preferred conductive fibers are carbon fibers based on natural or pyrolytic graphite which have been coated (doped) with a conductive, metal such as nickel, silver, aluminum or copper, preferably nickel, at a coating thickness of from about 0.5 to about 2 micron. The conductive coating comprises from about 3 to about 25% by weight of the fiber. These fibers are commercially available, e.g. from American Cyanamide Corp., and known for uses as reinforcing fibers in composites prepared by injection molding processes. They are generally provided in the form of one quarter inch long fiber bundles of about 12,000 fibers per bundle, bound together by a binder polymer such as polyvinyl-alcohol or polyvinyl acetate. These bundles may be washed in suitable solvent to remove the binder material and may further optionally be fluffed by impaction in a suitable mill or grinder to separate the individual strands and provide a lower density fiber fluff.

Preferred fibers have a length in the order of from about 0.10 to 0.50 inches, preferably less than about 0.40 inch and a diameter of about 3–15 microns, preferably from 5 to 10 microns. The preferred ratio of conductive powder to conductive fiber ranges from about 1:1 to about 20:1, respectively.

Metal flake material which may be optionally included in the composition include flat or oval shaped metal particles containing metals or metal alloys of silver, aluminum, nickel or copper. The preferred metal is nickel. Suitable flake material will have a thickness of 0.005 inch or less and surface dimensions of about 0.1 inch or less.

The conductive powders, fibers and optional flake components may be further treated with suitable coupling agents such as silane or titanate coupling agents to enhance bonding and compatability with any binder polymers which are present in the composition.

The compositions of the present invention may optionally contain an organic compound containing one or more cyano groups in the molecule. The presence of this material has been found to add materially to the electromagnetic absorptive properties of the composition, particularly where the composition will be used as a pliable caulking material. Examples of suitable cyano containing materials are liquid to semi-solid polymers of acrylonitrile or methacrylonitrile having a molecular weight in the dimer or trimer range up to about 2000 such as polyacrylonitrile or copolymers of a diolefin and acrylonitrile such as butadiene/acrylonitrile random copolymers. Other such materials include alkyl cyanides containing from 1 to 12 carbon atoms such as acetonitrile, propionitrile, isobutyronitrile, octylcyanide and the like.

The combination of conductive fibers, conductive powder and one or more of the optional components provide a preferably synergestic effect in enhancing the electromagnetic shielding properties of the composition at both high and low frequencies and give rise to a shield material of improved conductivity. The amount of these ingredients present in the composition may vary depending on whether the composition is used as a caulking material or applied as a paint, or is formed into a gasket, sheet or other material. Generally speaking, the conductive fiber material is present in the composition at a level of from about 1 to about 10% by weight (all percentages expressed as % by weight based on the weight of the total composition) and the conductive powder material is present at a level of from about 10 to about 60% by weight. The weight ratio of the powder to fiber may range from about 1:10 to about 20:1 respectively. Most preferably the composition contains a higher level of conductive powder than fiber at a preferred weight ratio of from about 3:1 to about 15:1 respectively.

The composition may also desirably contain the conductive flake material, particularly where it is formed into the shape of a sheet or gasket material. This material replaces a portion of the conductive fiber and conductive powder which is also present in the composition. Generally speaking, the flake may be included at levels from about 1 to about 35% by weight of the composition such that the weight ratio of flake to conductive powder is within the range of from about 10:1 to 1:10. When used, the flake is present at a preferred level of from about 20 to about 30% by weight of the composition.

The cyano containing component is a particularly desirable additive when the shielding composition is used as a caulk and is therefore not compressed as in the case of sheet or gasket materials. When used, it is generally present at a level sufficient to enhance the electromagnetic absorption properties of the composition, generally in the range of from about 1 to about 25% by weight of the composition.

Two preferred compositions of this invention formulated for caulking compounds and gasket/sheet material contain the following ingredients at the following preferred percentages by weight:

|  | CAULK | SHEET/GASKET |
| --- | --- | --- |
| SILICONE MATRIX OIL | 20–30 | — |
| CYANO COMPONENT | 5–25 | 0–15 |
| NICKEL FLAKE | 0–20 | 10–35 |
| DOPED TIN OXIDE | 40–60 | 5–30 |
| CONDUCTIVE FIBERS | 3–7 | 1–5 |
| POLYMERIC MATRIX | — | 35–75 |

The composition may also include other components to facilitate processing such as a plasticizer. Suitable plasticizers include di-alkyl esters of dicarboxylic acids such as di-octyl phthalate, dibutyl phthalate, di-butyl sebacate, di-octyl adipate and like materials, These are particularly useful additives for caulking compounds and tend to make the caulk more pliable and may also contribute to the shielding properties. Plasticizers are generally used at levels of about 2–7% by weight of the composition.

The above compositions may also be formulated with organic solvents which dissolve the matrix material to form dispersions which may then be painted or sprayed onto suitable substrates such as metal, glass, plastic or electronic components to provide electromagnetic shielding for such substrates.

Caulking materials are preferably prepared by first forming an intimate mixture of the conductive powder and the silicone oil in a suitable mixing device. Thereafter the cyano-containing compound and plasticizer (if any) are added to the composition and mixing is continued. The conductive fiber is then incorporated into the mixture and mixing continued until a caulk having a pliable, putty-like consistency is obtained. More solid or liquid material can be added as needed to achieve this consistency.

This caulk offers shielding without being compressed and does not harden over extended periods of time. It can therefore be applied to cracks and crevices in and around electronic devices and subsequently be removed if desired.

Gasket and EMS sheet and curtain materials are preferably prepared by first mixing the conductive particles (powder and optionally flake) with the curable elastomeric composition (mixture of polymer, crosslinking agent and catalyst) in a suitable mixing device such as a Banbury mixer at room temperature. Then the conductive fiber material is added and mixing is continued. Sheet or gasket material may be prepared by compressing the composition in a flat plate mold to the desired thickness or by calendaring techniques, after which the article is subjected to conditions which will initiate crosslinking. These conditions include temperatures ranging from room temperature in the case of room temperature curable silicone rubber to higher temperatures which may be necessary for other elastomer curing systems. The thickness of the final cured sheet may range from about 0.05 to above 0.5 inch or more.

Compositions containing a thermoset resin may be prepared by the above general mixing procedure using the appropriate resin and curing catalyst mixture. This mixture may then be molded into the desired shape or form and subjected to curing conditions. Alternatively, the mixture may be used to prepare fiber reinforced composites by impregnating a fabric substrate (e.g., fiberglass, carbon fiber, KEVLAR TM) and molding the composite into the desired shape by methods known in the art.

Thermoplastic compositions may be prepared by mixing techniques well known in the art. For example, the ingredients may be placed into an extrusion compounder with the thermoplastic resin to produce molding pellets wherein the additive ingredients are dispersed in a matrix of the thermoplastic resin. Alternatively, the ingredients may be mixed with a thermoplastic resin by dry blending, then either fluxed on a mill and comminuted, or extruded and chopped. Further, the ingredients may also be mixed with powder or granular thermoplastic resin and directly molded, e.g., by injection or other molding techniques.

In addition, the conductive thermoplastic compositions of the present invention may be prepared by first forming a concentrate of any one or more of the conductive additives in base thermoplastic resin or any compatible thermoplastic resin and thereafter the concentrate is incorporated into the composition by any of the foregoing methods or methods known in the art.

The compositions or composites of the present invention may be molded, foamed, extruded or otherwise shaped into various structures or articles, especially into electrical or electronic equipment components or housings requiring shielding. Examples include, but are not limited to, panel boards for printed circuits, radio and television panels and housings, housings for computers, communication equipment, large calculators, audio and high fidelity equipment, sensitive test instruments and the like.

The following examples are illustrative of the invention.

EXAMPLE 1

An EMS caulk material having the following composition was prepared:

|  | Parts by Weight |
|---|---|
| SILICONE FLUID (DOW CORNING SILASTIC 590) | 23.4 |
| ANTIMONY DOPED $SnO_2$ POWDER | 47.2 |
| Ni DOPED GRAPHITE FIBER | 6.7 |
| POLYACRYLONITRILE | 10.0 |
| LIQUID BUTADIENE/ ACRYLONITRILE COPOLYMER | 9.5 |
| ADIPATE PLASTICIZER | 3.2 |

The powder used in this formulation consisted of tin oxide surface coated with antimony and had an average particle size of about 2 to 3 microns. The graphite fiber consisted of fluffed ¼" long strands of graphite core having a diameter of about 7 microns and a surface coating of nickel having a thickness of about 1 micron.

The ingredients were formulated by first mixing the liquid ingredients with the antimony doped powder and then mixing in the nickel doped fibers as the final ingredient and continuing mixing until the fibers were uniformly distributed. The mixture formed a caulk of putty-like consistency.

The caulking prepared in Example 1 was evaluated for EMS properties by a Mil-STD-285 test. Shielding effectiveness is a measure of the attenuation of EMI/RFI expressed in decibels wherein attenuation is a function of the electrical conductivity and/or magnetic susceptibility of the shield. The decibel unit is a logarithmic measure of the degree of the shielding. A 10 decibel reading indicates that 90% of the EMI/RFI energy is effectively dissipated. Twenty decibels means that 99% of the EMI/RFI is dissipated, and so on. The shielding effectiveness is measured at various frequencies in MegaHertz (MHz.) or GigaHertz (GHz.). Shielding effectiveness was determined over a frequency range of 200 MHz to 15 GHz. Test results reported in decibels (dB) with a plus or minus 10 to 15% accuracy were as follows:

| FREQUENCY | dB UNITS |
|---|---|
| 200 MHz | 81 |
| 400 MHz | 77 |

-continued

| FREQUENCY | dB UNITS |
|---|---|
| 600 MHz | 108 |
| 800 MHz | 110 |
| 1 GHz | 101 |
| 2 GHz | 97 |
| 3 GHz | 107 |
| 5 GHz | 96 |
| 7 GHz | 92 |
| 9 GHz | 96 |
| 11 GHZ | 107 |
| 13 GHz | 106 |
| 15 GHz | >108 |

The above data shows that the caulk has exceptional shielding properties.

EXAMPLES 2-3

Two additional caulking compositions were prepared by the method of Example 1. These formulations had the following composition in parts by weight:

|  | EX 2 | EX 3 |
|---|---|---|
| SILICONE FLUID | 22.3 | 22.3 |
| SILICONE WAX | 5.5 | 5.5 |
| NICKEL FLAKE | 9.5 | 31.9 |
| ANTIMONY DOPED Sn POWDER | 44.9 | 22.5 |
| LIQ. BUTADIENE/ACRYLONITRILE | 9.0 | 9.0 |
| NICKEL DOPED GRAPHITE FIBER | 5.2 | 5.2 |
| ADIPATE PLASTICIZER | 3.6 | 3.6 |

These compositions also exhibited extremely good EMS properties when tested as above.

EXAMPLE 4

An EMS sheet material having the following composition was prepared:

|  | PARTS BY WEIGHT |
|---|---|
| SILICONE ELASTOMER (ROOM TEMP. CURABLE) | 72 |
| NICKEL FLAKE | 17 |
| NICKEL DOPED GRAPHITE FIBER | 3 |
| ANTIMONY DOPED Sn POWDER | 8 |

The elastomer composition, including conventional silane crosslinking agent and catalyst, were first mixed with the metal flake and metal powder ingredients until a uniform mixture was obtained. The fiber was then gradually added to this mixture until it was uniformly dispersed therein.

A sheet material having a thickness of about ⅛ inch was formed by placing the composition in a flat bed press, compressing the material to form a sheet and permitting the sheet material to cross link at room temperature.

Electromagnetic shielding properties for this material were determined as above with the following results:

| FREQUENCY | dB UNITS |
|---|---|
| 200 MHz | 77 |
| 400 MHz | 87 |
| 600 MHz | 82 |
| 800 MHz | 89 |
| 1 GHz | 86 |
| 2 GHz | 87 |
| 4 GHz | 81 |
| 6 GHz | 89 |

| -continued | |
|---|---|
| FREQUENCY | dB UNITS |
| 8 GHz | 97 |
| 10 GHz | 105 |
| 15 GHz | 102 |
| 17 GHz | 94 |

The data shows that the sheet material has exceptional shielding properties throughout all test frequencies. Such sheets can be cut or preformed into EMS gaskets.

EXAMPLE 5

This example illustrates the preparation of an EMS structural composite material. The following components were mixed:

| | PARTS BY WEIGHT |
|---|---|
| CURABLE POLYESTER RESIN | 55 |
| Ni DOPED GRAPHITE FIBER | 5 |
| NICKEL FLAKE | 20 |
| Sb DOPED SnO₂ POWDER | 20 |

All ingredients were mixed with the polyester resin until a uniform mixture was produced. A woven KEVLAR TM fabric material was then impregnated with the EMS composition after which the polyester resin was thermally crosslinked.

The composite exhibited an EMS result of 73 dB at 10 GHz, the only data point obtained.

Other modifications and variations of the present invention are possible in light of the above disclosure. For example, these compositions may further comprise antioxidants, stabilizers, flow promoters, mold release agents, UV stabilizers, flame retardants and the like, as necessary. It is therefore to be understood that changes may be made in the particular embodiments of the invention described which are within the full intended scope of the invention so defined by the appended claims.

What is claimed is:

1. An electromagnetic shielding composition comprising a mixture of:
   i) a matrix component selected from the group consisting of silicone oils, curable elastomers, thermoplastic polymers, thermosetting polymers and mixtures thereof; and
   ii) a synergistic combination of electromagnetic shield enhancing additives comprising a mixture of:
      a) from about 1 to about 10% by weight of said composition of at least one conductive fiber material;
      b) from about 5 to about 60% by weight of said composition of a conductive powder material, said powder comprising a metal oxide or metal sulfide core coated with a conductive metal, wherein the weight range of said powder to said fiber is in the range of about 1:10 to about 20:1 respectively;
      c) from about 0 to about 35% by weight of said composition of a conductive metal flake material;
      d) from 0 to about 25% by weight of said composition of a liquid organic compound containing at least one cyano group per molecule;

said additives being uniformly dispersed in said matrix material.

2. The composition of claim 1 wherein said matrix material is a silicone oil.

3. The composition of claim 2 wherein said conductive fiber material is graphite coated with nickel.

4. The composition of claim 3 wherein said fiber has a length of less than about 0.4 inches and a diameter in the range of from about 3 to about 15 microns.

5. The composition of claim 2 wherein said conductive powder material is a metal oxide powder coated with a metal selected from antimony or indium.

6. The composition of claim 5 wherein said conductive powder material is tin oxide coated with antimony.

7. The composition of claim 2 which contains at least about 1% by weight of said conductive metal flake material.

8. The composition of claim 7 wherein said metal flake material is nickel.

9. The composition of claim 1 wherein said matrix material is a curable elastomer.

10. The composition of claim 9 wherein said elastomer is silicone rubber.

11. The composition of claim 10 which contains at least about 1% by weight of said conductive metal flake material.

12. The composition of claim 11 which contains from about 15 to about 35% by weight of said flake material and about 5 to about 30% by weight of said conductive powder material.

13. The composition of claim 12 wherein said conductive powder material is a metal oxide powder coated with a metal selected from antimony or indium.

14. The composition of claim 13 wherein said conductive powder material is tin oxide coated with antimony.

15. The composition of claim 12 wherein said fiber has a length of less than about 0.4 inches and a diameter in the range of from about 5 to about 10 microns.

16. The composition of claim 14 wherein said conductive flake material is nickel flake.

17. The composition of claim 1 wherein said matrix material is a thermosetting polymer.

18. The composition of claim 17 which contains at least about 1% by weight of said conductive metal flake material.

19. The composition of claim 18 which contains from about 15 to about 35% by weight of said flake material and about 5 to about 30% by weight of said conductive powder material.

20. The composition of claim 19 wherein said conductive powder material is a metal oxide powder coated with a metal selected from antimony or indium.

21. The composition of claim 20 wherein said conductive powder material is tin oxide coated with antimony.

22. The composition of claim 21 wherein said fiber has a length of less than about 0.4 inches and a diameter in the range of from about 5 to about 10 microns.

23. The composition of claim 22 wherein said conductive flake material is nickel flake.

24. A pliable caulking composition for electromagnetic shielding applications comprising a uniform admixture of:
   a) an organopolysiloxane oil;
   b) about 5 to about 25% by weight of said composition of a liquid organic compound containing at least one cyano group per molecule;

c) about 1 to about 10% by weight of said composition of a conductive fiber material;
d) about 10 to about 60% by weight of said composition of a conductive powder material, and
e) from 0 up to about 35% by weight of said composition of a conductive metal flake material.

25. The composition of claim 24 wherein said a liquid organic compound is a polymer containing polymerized acrylonitrile or methacrylonitrile.

26. The composition of claim 24 wherein said conductive powder material has an average particle size in the range from about 0.1 to about 25 microns and is present in the composition at a level of from about 40 to about 60% by weight.

27. The composition of claim 26 wherein said conductive powder is a metal oxide core coated with antimony or indium.

28. The composition of claim 27 wherein said metal oxide is tin oxide.

29. The composition of claim 24 wherein said conductive fiber has a length of less than about 0.4 inch and a diameter in the range of from about 3 to about 15 microns, and is present in said composition at a level of from about 3 to about 7% by weight.

30. The composition of claim 29 wherein said conductive fiber is graphite coated with a conductive metal which constitutes from about 3 to about 25% by weight of said fiber.

31. The composition of claim 30 wherein said conductive metal is nickel.

32. The composition of claim 24 which contains at least about 1% by weight of said conductive flake.

33. The composition of claim 32 wherein said flake is nickel.

34. The composition of claim 24 wherein said organopolysiloxane is present in said composition at a level of from about 20 to about 30% by weight.

35. The composition of claim 34 wherein said organopolysiloxane is polydimethylsiloxane.

36. The composition of claim 24 which further contains a plasticizer selected from dialkyl esters of dicarboxylic acids.

37. A flexible elastomeric sheet material for electromagnetic shielding applications comprising a uniform admixture of:
a) a cured elastomeric polymer;
b) about 1 to about 10% by weight of said sheet material of a conductive fiber material;
c) about 5 to about 60% by weight of said sheet material of a conductive powder material said powder comprising a metal oxide or metal sulfide core coated with a conductive metal; and
d) from about 1 to about 35% by weight of said sheet material of a conductive metal flake material, said components b, c and d uniformly dispersed in said cured elastomeric polymer.

38. The sheet material of claim 37 wherein said conductive powder material has an average particle size in the range from about 0.1 to about 25 microns and is present in the composition at a level of from about 40 to about 60% by weight.

39. The sheet material composition of claim 38 wherein said conductive powder is a metal oxide core coated with antimony or indium.

40. The sheet material of claim 39 wherein said metal is tin oxide.

41. The sheet material of claim 37 wherein said conductive fiber has a length of less than about 0.4 inch and a diameter in the range of from about 3 to about 15 microns, and is present in the composition at a level of from about 3 to about 7% by weight.

42. The sheet material of claim 41 wherein said conductive fiber is graphite coated with a conductive metal which constitutes from about 3 to about 25% by weight of said fiber.

43. The sheet material of claim 42 wherein said conductive metal is nickel.

44. The sheet material of claim 37 which contains from about 15 to about 35% by weight of said conductive flake.

45. The sheet material of claim 44 wherein said flake is nickel.

46. The sheet material of claim 37 wherein said elastomeric polymer is present in said sheet material at a level of from about 35 to about 75% by weight.

47. The sheet material of claim 46 wherein said elastomeric polymer is silicone rubber.

48. An electromagnetic shielding composition comprising a mixture of:
i) a matrix component selected from the group consisting of curable elastomers, thermoplastic polymers, thermosetting polymers and mixtures thereof; and
ii) a synergistic combination of electromagnetic shield enhancing additives comprising a mixture of:
a) from about 1 to about 10% by weight of said composition of at least one conductive fiber material;
b) from about 5 to about 60% by weight of said composition of a conductive powder material, wherein the weight range of said powder to said fiber is in the range of about 1:10 to about 20:1 respectively;
c) from 0 to about 35% by weight of said composition of a conductive metal flake material; and
d) from 1 to about 25% by weight of said composition of a liquid organic compound containing at least one cyano group per molecule;
said additives being uniformly dispersed in said matrix material.

49. The composition of claim 48 wherein said matrix material is a polysiloxane elastomer.

50. The composition of claim 48 wherein said organic compound is liquid polyacrylonitrile, a liquid copolymer of butadiene and acrylonitrile or a mixture thereof.

51. The composition of claim 48 wherein said conductive fiber material is graphite coated with nickel.

52. The composition of claim 51 wherein said fiber has a length of less than about 0.4 inches and a diameter in the range of from about 3 to about 15 microns.

53. The composition of claim 48 wherein said conductive powder material is a metal oxide powder coated with a metal selected from antimony or indium.

54. The composition of claim 53 wherein said conductive powder material is tin oxide coated with antimony.

55. The composition of claim 48 which contains at least about 1% by weight of said conductive metal flake material.

56. The composition of claim 55 wherein said metal flake material is nickel.

57. The composition of claim 55 which contains from about 15 to about 35% by weight of said flake material and about 5 to about 30% by weight of said conductive powder material.

58. The composition of claim 57 wherein said conductive powder material is a metal oxide powder coated with a metal selected from antimony or indium.

59. The composition of claim 58 wherein said conductive powder material is tin oxide coated with antimony.

* * * * *